US008580378B2

(12) United States Patent
Noguchi

(10) Patent No.: US 8,580,378 B2
(45) Date of Patent: Nov. 12, 2013

(54) ORGANIC GLASS FOR AUTOMOBILE AND PROCESS FOR PRODUCING THE SAME

(75) Inventor: Masumi Noguchi, Anjo (JP)

(73) Assignee: Kojima Press Industry Co., Ltd., Toyota-Shi (JP)

( * ) Notice: Subject to any disclaimer, the term of this patent is extended or adjusted under 35 U.S.C. 154(b) by 231 days.

(21) Appl. No.: 12/955,165

(22) Filed: Nov. 29, 2010

(65) Prior Publication Data

US 2011/0129664 A1 Jun. 2, 2011

(30) Foreign Application Priority Data

Dec. 1, 2009 (JP) ................................ 2009-273520

(51) Int. Cl.

*B32B 27/42* (2006.01)
*C23C 14/12* (2006.01)
*C23C 14/24* (2006.01)

(52) U.S. Cl.

USPC ........... 428/336; 428/524; 428/460; 428/480; 428/505; 427/255.394; 427/255.6; 427/255.7

(58) Field of Classification Search

USPC ......... 428/336, 457, 460, 480, 505, 524, 688; 427/255.394, 255.6, 255.7

See application file for complete search history.

(56) References Cited

U.S. PATENT DOCUMENTS

| | | | | |
|---|---|---|---|---|
| 6,340,404 | B1 * | 1/2002 | Oka et al. ...................... | 156/230 |
| 7,018,057 | B2 * | 3/2006 | Richard ........................ | 359/883 |
| 2008/0265459 | A1 * | 10/2008 | Gasworth et al. ............ | 264/255 |

FOREIGN PATENT DOCUMENTS

| | | | |
|---|---|---|---|
| DE | 100 12 516 | C1 | 12/2001 |
| DE | 102 50 564 | A1 | 5/2004 |
| EP | 0649047 | | 11/2003 |
| EP | 2 135 971 | A1 | 12/2009 |
| JP | 02-066172 | A1 | 3/1990 |
| JP | H05-222110 | | 8/1993 |
| JP | H07-294702 | | 11/1995 |
| JP | 09-239937 | A1 | 9/1997 |
| JP | 11-227092 | A1 | 8/1999 |
| JP | 2002-275619 | | 9/2002 |
| JP | 2002-292779 | | 10/2002 |
| JP | 2004-175904 | A1 | 6/2004 |
| JP | 2004-237513 | A1 | 8/2004 |
| JP | 2005-015790 | | 1/2005 |
| JP | 2005-035248 | | 2/2005 |
| JP | 2005-035249 | | 2/2005 |
| JP | 3726241 | | 12/2005 |
| WO | 2006/063388 | A1 | 6/2006 |

OTHER PUBLICATIONS

Japanese Office Action, Japanese Application No. 2009-273520, dated Jul. 16, 2013 (2 pages).

* cited by examiner

*Primary Examiner* — Thao T. Tran
(74) *Attorney, Agent, or Firm* — Burr & Brown

(57) ABSTRACT

An organic glass for automobile is provided which has excellent weatherability, wear-resistance and abrasion-resistance, and which can be mass-produced by a simple and inexpensive process. The organic glass comprises a transparent resin base plate 12 and a hard coat layer 14 formed on at least one surface of the resin base plate. The hard coat layer includes an organic thin film 16 formed by vacuum deposition polymerization.

11 Claims, 2 Drawing Sheets

ORGANIC GLASS FOR AUTOMOBILE AND PROCESS FOR PRODUCING THE SAME

The present application is based on Japanese Patent Application No. 2009-273520 filed on Dec. 1, 2009, the contents of which are incorporated herein by reference.

BACKGROUND OF THE INVENTION

1. Field of the Invention

The present invention relates to an organic glass for automobile and a process for producing the organic glass for automobile, and in particular to an organic glass for automobile that is favorably used as a front glass, a rear glass, a window glass, and the like for automobile, and to a process for advantageously producing the organic glass for automobile.

2. Discussion of Related Art

In recent years, weight reduction of automobile is promoted to protect the environment and to improve fuel efficiency. As one way of reducing the weight, the use of the organic glass in an automobile has been studied. As a material of the organic glass (resin glass) for automobile, various resin materials that are able to form a transparent flat plate can be employed. Examples of the resin materials include polycarbonate, polymethyl methacrylate, polyethylene terephthalate, polyethylene naphthalate, polyethylene, polypropylene, and ABS. Among these resin materials, polycarbonate is favorably employed, because it is excellent in impact-resistance, heat-resistance, and transparency. However, the organic glass has lower surface hardness than the inorganic glass, no matter what kind of resin is used to form the organic glass. Thus, wear-resistance and abrasion-resistance of the organic glass is insufficient, and also weatherability is poor.

To solve the above problem, JP-A-9-239937 and JP-A-11-227092, for example, propose an organic glass which includes a hard coat layer obtained by applying an organic coating material such as a silicon coating material on a surface of a transparent resin base plate formed of polycarbonate. Further, JP-A-2-66172, JP-A-2004-237513, and JP-A-2004-175904 propose an organic glass that includes a hard coat layer having a multilayer structure, which is formed on a surface of a transparent resin base plate made of polycarbonate. The multilayer structure consists of a coating film, which is formed of an organic coating material such as a silicon coating material or an acrylic coating material, and a thin film of silicon oxide ($SiO_2$), which is formed on the coating film by a vacuum deposition process such as plasma CVD, sputtering, and electron beam deposition.

When the organic glass includes a hard coat layer containing a coating film formed of an organic coating material that is positioned on a surface of the resin base plate, the weatherability can be improved by the presence of the coating film formed of the organic coating material. Further, the organic glass can have better weatherability by adding an ultraviolet (UV) absorber or infrared (IR) absorber, for example, into the organic coating material. The organic glass that contains a hard coat layer having a multilayer structure consisting of a coating film formed of an organic coating material and a thin film of silicon oxide can have a surface hardness that is equivalent to an inorganic glass by the presence of the thin film of silicon oxide, thereby, stably securing sufficient wear-resistance and abrasion-resistance.

However, the above conventional organic glass involves the following problems. When the conventional organic glass is produced, a coating operation is performed to form the hard coat layer including the organic coating film. The coating operation is a wet type process, and thus a drying process is required. In addition, when the organic coating film has a multilayer structure, the drying process should be repeated. Further, the resin base plate formed of polycarbonate, for example, has poor adhesion to the organic coating material. Therefore, when the hard coat layer including the organic coating film is formed on a surface of the resin base plate, a primer layer should be formed between the resin base plate and the hard coat layer to improve the adhesion thereof.

Thus, the conventional organic glass requires an operation that involves a lot of time and labor in order to form the hard coat layer including the organic coating film. Further, as equipments for forming an organic coating film, the conventional organic glass requires equipment for purifying the space for coating operation in order to prevent a foreign substance from being mixed into the coating film, in addition to the coating equipment for organic coating material and the drying equipment. Therefore, cost of equipments is inevitably increased.

In the formation of the hard coat layer including the organic coating film, when the organic coating material into which a large amount of an ultraviolet absorber or an infrared absorber is added is used, problems such as reduction in pot life of the coating material and deterioration of leveling properties due to the increased viscosity may be arisen. Therefore, there is a limit to the improvement in the weatherability of the conventional organic glass that is obtained by the addition of the ultraviolet absorber or infrared absorber into the organic coating material.

Further, the organic glass containing the hard coat layer having the multilayer structure consisting of the organic coating film and the inorganic coating film formed by a vacuum deposition process requires both of the dry coating process and the wet vacuum deposition process in the production thereof. Therefore, a large-scale equipment is needed and the cost thereof is inevitably high.

SUMMARY OF THE INVENTION

Therefore, the present invention has been made in the light of the situations described above, and an object of the invention is to provide an organic glass for automobile that is excellent in weatherability, wear-resistance and abrasion-resistance and that can be mass produced by a simple and low cost process. It is another object of the present invention to provide a process for advantageously and economically producing the organic glass for automobile in a shorter production cycle.

To attain the aforementioned objects, or solve the problems understood from the description throughout the present specification and drawings, the present invention may be preferably embodied according to various aspects which will be described below. Each aspect described below may be employed in any combination. It is to be understood that the aspects and technical features of the present invention are not limited to those described below, and can be recognized based on the inventive concept disclosed in the whole specification and the drawings.

The object of the present invention may be achieved by a first aspect of the present invention, which provides an organic glass for automobile comprising a transparent resin base plate and a hard coat layer formed on at least one surface of the resin base plate, wherein the hard coat layer includes an organic thin film of polymer formed by vacuum deposition polymerization. Here, the term "transparent" includes colored transparent in addition to clear and colorless transparent. Hereinafter, this term will be used in the same meaning.

According to a preferable aspect of the organic glass for automobile of the present invention, the organic thin film is a thin film of polyurea resin.

According to another preferable aspect of the organic glass for automobile, the organic thin film has a thickness within a range of 10 to 100 μm.

According to a preferable aspect of the organic glass for automobile of the present invention, the organic thin film is constituted by a plurality of layers composed of different compositions.

According to a favorable aspect of the organic glass for automobile of the present invention, the hard coat layer further includes an inorganic thin film that is formed by a vacuum deposition process on the organic thin film at the side opposite to the resin base plate.

According to another favorable aspect of the organic glass for automobile, the inorganic thin film has a thickness within a range of 100 nm to 20 μm When the hard coat layer has a multilayer structure consisting of the organic thin film and the inorganic thin film, it is preferable that the inorganic thin film is a thin film comprising a metal compound.

When the hard coat layer has a multilayer structure including the organic thin film and the inorganic thin film, it is favorable that the inorganic thin film is a thin film of silicon oxide ($SiO_2$).

According to an advantageous aspect of the organic glass for automobile of the present invention, the resin base plate is formed of a resin material selected from the group consisting of polymethyl methacrylate, polyethylene terephthalate, polyethylene naphthalate, polyethylene, polypropylene, and ABS.

According to a favorable aspect of the organic glass for automobile of the present invention, at least one of an ultraviolet absorber, an infrared absorber, pigment and silane coupling agent is contained in the hard coat layer by a vacuum deposition process.

Further, the above-described another object regarding the production process for the organic glass for automobile may be achieved by a second aspect of the present invention, which provides a process for producing an organic glass for automobile, including the steps of: (a) providing a transparent resin base plate; and (b) forming an organic thin film of polymer on at least one surface of the resin base plate by a vacuum deposition polymerization, thereby forming a hard coat layer including the organic thin film on at least one surface of the resin base plate.

According to a preferable aspect of the process for producing an organic glass for automobile, the vacuum deposition polymerization is performed by introducing a plurality of kinds of monomers or raw materials evaporated in a plurality of evaporation source containers into a deposition chamber in a vacuum state, while changing a combination of the monomers to be introduced into the deposition chamber with the passage of time, so that the organic thin film formed on the at least one surface of the resin base plate is constituted by a plurality of layers composed of different compositions.

In the organic glass for automobile according to the present invention, the organic thin film included in the hard coat layer has a high-molecular weight and a cross-linked structure. Accordingly, the weatherability, wear-resistance and abrasion-resistance of the whole organic glass can be advantageously improved due to the formation of the organic thin film on the resin base plate.

In the organic glass for automobile of the present invention, the organic thin film is formed on the resin base plate by the dry type vacuum deposition polymerization. Thus, unlike the conventional organic glass for automobile in which an organic coating film for improving the weatherability, for example, is formed on a resin base plate by a wet type coating process, there is no need to perform the drying process in the formation of the organic thin film. Further, there is no need to additionally provide equipment for purifying the deposition chamber to the deposition apparatus of the organic thin film, because the organic thin film is formed in vacuum. Further, the organic thin film has higher adhesion to the resin base plate than the organic coating film. Accordingly, there is also no need to form a primer layer between the organic thin film and the resin base plate in order to improve the adhesion.

To further improve the wear-resistance and abrasion-resistance of the organic glass for automobile of the present invention, an inorganic thin film may be formed on the organic thin film by the vacuum deposition process. In that case, both of the organic thin film and the inorganic thin film are formed by a dry type process. Accordingly, compared with the conventional product including an organic coating film formed by a wet type coating process, the wear-resistance and abrasion resistance of the organic glass for automobile of the present invention can be surely improved at lower cost due to the inorganic coating film formed by the dry type vacuum deposition process.

Consequently, the organic glass for automobile of the present invention can advantageously exhibit excellent weatherability, wear-resistance and abrasion-resistance, and further can effectively improve productivity and mass productivity and can reduce the production cost.

Further, according to the process for producing the organic glass for automobile of the present invention, the organic glass for automobile having excellent weatherability, wear-resistance and abrasion-resistance can be effectively and economically produced with excellent productivity.

BRIEF DESCRIPTION OF THE DRAWINGS

The above and other objects, features, advantages and technical and industrial significance of the present invention will be better understood by reading the following detailed description of a preferred embodiment of the invention, when considered in connection with the accompanying drawings, in which.

DETAILED DESCRIPTION OF THE INVENTION

To further clarify the present invention, there will be described a typical embodiment of the invention in detail with reference to the accompanying drawings.

Figure 1:
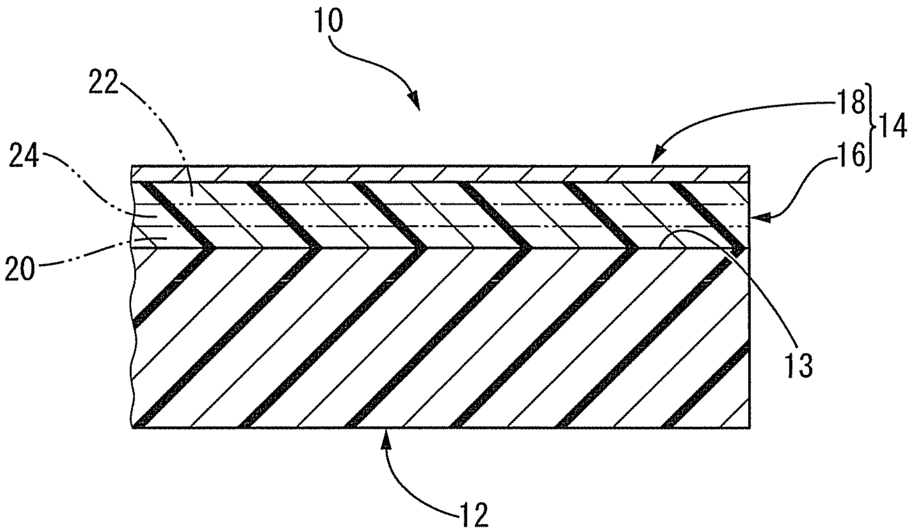
FIG. 1 is a partial cross sectional view showing one example of an organic glass for automobile having a structure according to the present invention.

Initially, FIG. 1 shows an example of an organic glass for automobile having a structure according to the present invention, which is used as a window glass for automobile, in a vertical cross sectional view. As apparent from FIG. 1, an organic glass or resin glass 10 includes a resin base plate 12 and a hard coat layer 14 formed on a smooth surface 13, which is one surface of the resin base plate 12.

More specifically described, the resin base plate 12 is clear and colorless and has a plate shape as a whole. Here, the resin base plate 12 is an injection-molded product formed by using polycarbonate.

Material of the resin base plate 12 is not limited to polycarbonate. Any resin material which can form a clear and colorless plate may be employed. Examples of the materials of the resin base plate 12 include, polymethyl methacrylate, polyethylene terephthalate, polyethylene naphthalate, polyethylene, polypropylene, and ABS. Among the resin materials, one to be used is suitably selected in view of necessary properties (for example, clearness, hardness and impact resistance) as an organic glass for automobile.

The resin base plate 12 is not necessarily clear and colorless. For example, the resin base plate 12 may be colored transparent of light brown color or blue, which is generally used for a window glass for automobile. Further, on a surface of the resin base plate 12, there may be formed, for example, a coating layer having functionalities such as adhesion improvement, ultraviolet protection or infrared cut, a printing layer having predetermined characters or pictures thereon, an antenna pattern, or heater elements.

The hard coat layer 14 formed on the surface 13 of the above-described resin base plate 12 includes an organic thin film 16 of polymer and an inorganic thin film 18. The organic thin film 16 is formed on the surface 13 of the resin base plate 12 and the inorganic thin film 18 is formed on the organic thin film 16. In other words, the hard coat layer 14 has a multilayer structure including the organic thin film 16 formed on the surface 13 of the resin base plate 12 and the inorganic thin film 18 formed on the organic thin film 16 at the side opposite to the resin base plate 12.

The organic thin film 16 is formed on the surface 13 of the resin base plate 12 by performing the vacuum deposition polymerization in a known manner. The organic thin film 16 has a high molecular weight and cross-linked structure. Thus, the organic thin film 16 itself exhibits excellent weatherability, high wear-resistance and abrasion-resistance. Due to the presence of the hard coat layer 14 including the organic thin film 16 on the surface 13 of the resin base plate 14, the weatherability, high wear-resistance and abrasion-resistance of the organic glass 10 are improved.

The organic thin film 16 formed on the resin base plate 12 by vacuum deposition polymerization has uniformly controlled thickness and impurities therein is sufficiently reduced. As a result, surface properties and quality of the organic thin film 16 are improved. Here, the thickness of the organic thin film 16 is about 10 to 100 μm, for example. It is to be understood that, in FIG. 1, for ease of understanding of the structure of the organic glass 10, the resin base plate 12, the organic thin film 16 and the inorganic thin film 18 are not shown in the actual thickness. Especially, the thicknesses of the organic thin film 16 and the inorganic thin film 18 are shown in larger sizes than the actual sizes.

The organic thin film 16 has sufficiently high adhesion to the resin base plate 12. Thus, between the organic thin film 16 and the resin base plate 12, there is no need to provide a primer layer or the like to improve adhesion.

The organic glass 10 of the present embodiment has the organic thin film 16 that is formed of a transparent thin film made of polyurea resin. As is well known, the polyurea resin can readily form a transparent thin film by vacuum deposition polymerization. Further, in the polymerization of monomers (diisocyanate and diamine), the polyurea resin is formed by polyaddition polymerization reaction in which heat treatment is not required and elimination of by-product(s) such as water or alcohol is never occurred. Therefore, in the deposition of the organic thin film 16, the organic glass 10 including the organic thin film 16 formed of such polyurea resin does not require an apparatus for performing a heat treatment at the time of polymerization of monomers. As a result, cost of deposition can be advantageously reduced. Further, deformation of the resin base plate 12 by the heat of heat treatment can be advantageously prevented. Further, there is no need to remove by-product(s) such as water or alcohol eliminated by polymerization reaction of monomers from the vacuum chamber in which polymerization reaction proceeds, and the equipment for the removal is not required. As a result, cost of deposition of the organic thin film 16 and ultimately cost of the production of the organic glass 10 can be effectively reduced.

According to the present embodiment, the organic thin film 16, which is formed of polyurea resin film, is constituted by a plurality of layers composed of different compositions. Specifically, the organic thin film 16 is formed, in vacuum system, by polymerization of two kinds of evaporated monomers, i.e., diisocyanate and diamine, on the resin base plate 12. Here, combinations of two kinds of monomers that form a lower part 20 of the organic thin film 16, which is the resin base plate 12 side, an upper part 22, which is opposite to the resin base plate 12 side, and a middle part 24, which is positioned between the lower part 20 and the upper part 22, differ from each other.

Specifically, the lower part 20 of the organic thin film 16 is formed of a polymer of 1,3-bis(isocyanatemethyl)cyclohexane and 1,12-dodecanediamine, the middle part 24 is formed of a polymer of 1,3-bis(isocyanatemethyl)cyclohexane and methylene bis(4-cyclohexylamine), and the upper part 22 is formed of a polymer of 1,3-bis(isocyanatemethyl)cyclohexane and N-(2-aminoethyl)-3-aminopropyl methyl dimethoxy silane. Therefore, the organic thin film 16 is constituted by a plurality of layers composed of different compositions. It is to be noted that the lower part 20, the middle part 24 and the upper part 22 of the organic thin film 16 do not form a multilayer structure that has clear interfaces.

Thus, the lower part 20 of the organic thin film 16 is made to be relatively soft and exhibit excellent adhesion to the resin base plate 12. The upper part 22 is made to have sufficiently high hardness. The middle part 24 is made to have a hardness substantially intermediate between the lower part 20 and the upper part 22. By this arrangement, the adhesion of the organic thin film 16 to the resin base plate 12 is advantageously improved. Further, the hardness of the organic thin film 16 is made to become higher stepwise toward the surface thereof, i.e., there is difference in hardness of the resin base plate 12, which has lower surface hardness, and hardness of the organic thin film 16, which has higher hardness, thereby preventing crack and separation of the resin base plate 12 and the organic thin film 16 resulting from expansion and contraction caused by changes in ambient temperature.

The organic thin film 16 is not particularly limited to the thin film of polyurea resin. Any resin thin film that can be formed on the resin base plate 12 by a known vacuum deposition polymerization process may be employed as the organic thin film 16. For example, the organic thin film 16 may be a polyurethane resin thin film, a polyester resin thin film, a polyamide resin thin film, a polyimide resin thin film, a polyamide imide resin thin film, a polyazomethine resin thin film or an acrylic resin thin film. Two or more of the above resin thin films may be stacked to form the organic thin film 16 having a multilayer structure in which different kinds of resin thin films are stacked. When the organic thin film 16 is a polyurea resin thin film, the polyurea resin thin film may be an aromatic polyurea resin thin film or an aliphatic polyurea resin thin film.

Preferably, the organic thin film 16 is a resin thin film having transparency in order to secure the transparency of the whole organic glass 10. Even if a resin thin film does not have transparency, as long as it can exhibit light permeability by making the thickness thereof sufficiently small, for example, such a resin thin film can be sufficiently used as the organic thin film 16. This resin thin film that does not have transparency includes the resin thin film that is colored by containing pigment such as metal complex.

The inorganic thin film 18 which constitutes the hard coat layer 14 together with the organic thin film 16 is formed on the organic thin film 16 at the side opposite to the resin base plate 12 by a vacuum deposition process. This inorganic thin film 18 is formed of a silicon oxide thin film and has a thickness of about 100 nm to 20 μm.

As described above, the organic glass 10 of the present embodiment includes the hard coat layer 14 having the outermost layer (the uppermost layer) that is formed of the inorganic thin film 18, which is formed of silicon oxide thin film. Therefore, the surface hardness equivalent to the inorganic glass can be obtained, thereby securing excellent wear-resistance and abrasion-resistance. As a result, the organic glass 10 can be advantageously used as a windshield or rear window whose surface is rubbed by a wiper, or a window glass for side window, which is raised and lowered, for example.

The inorganic thin film 18 is not limited to the silicon oxide thin film. A thin film that is formed by a vacuum deposition process using inorganic material can be employed as the inorganic thin film 18, instead of the thin film of silicon oxide. The inorganic materials may be comprised of metal compounds such as silicon nitride, silicon carbide, titanium oxide, titanium nitride, zirconium oxide, indium-tin oxide, indium oxide, tin oxide, and magnesium fluoride. The inorganic thin film 18 formed of any one of the above inorganic materials can exhibit excellent wear-resistance and abrasion-resistance. The inorganic thin film 18 does not always have to have a single layer structure. The inorganic thin film 18 may have a multilayer structure including two or more layers that is formed by performing the vacuum deposition process using two or more kinds of the metal compounds selected from the above-described metal compounds and the silicon oxide.

Like the organic thin film 16, it is preferable that the inorganic thin film 18 has transparency in order to secure transparency of the whole of the organic glass 10. However, the inorganic thin film 18 may be opaque if the light permeability can be exhibited by making the thickness thereof sufficiently small, for example.

The process of production of the organic glass 10 having the above-described structure is as follows, for example.

First, injection molding is carried out by using polycarbonate resin to form the resin base plate 12 that is transparent. Other than the injection molding, any other molding methods which can form a resin molded article having a plate shape can be employed as a molding process for the resin base plate 12.

Secondly, the organic thin film 16 is formed on the smooth surface 13 of the thus molded resin base plate 12. In the formation of the organic thin film 16, an apparatus for forming an organic thin film or a film-forming apparatus 26 as shown in FIG. 2 may be used, for example.

Figure 2:
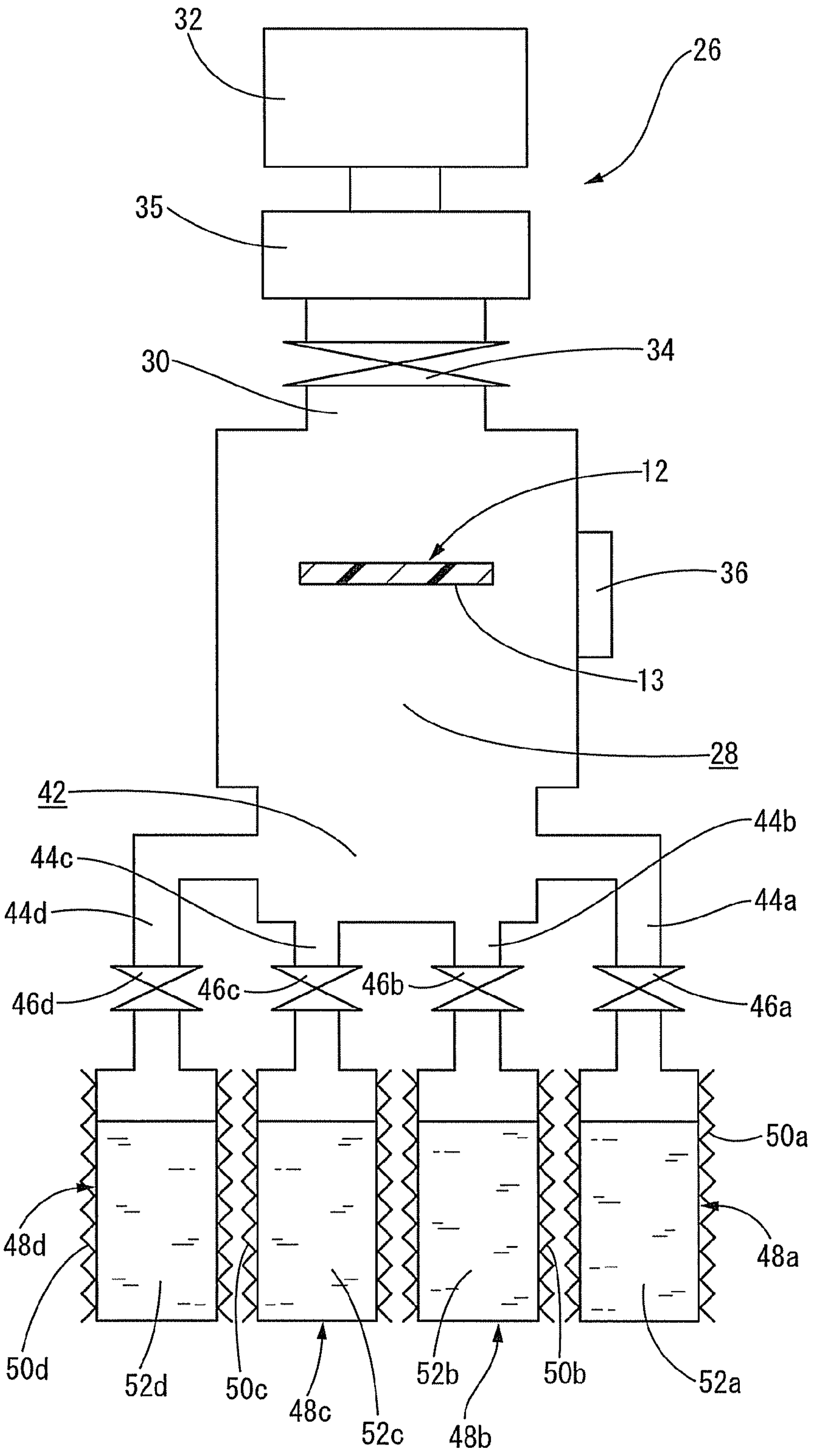
FIG. 2 is an explanatory view showing an apparatus for forming an organic thin film, which is used in the production of the organic glass for automobile shown in FIG. 1.

As shown in FIG. 2, the film-forming apparatus 26 has the deposition chamber 28. The deposition chamber 28 is a pressure-tight container, which can be hermetically closed, and has an opening that can be covered by a cover. Through this opening, the resin base plate 12 can be taken in and out. In the drawings, the opening and the cover are not shown.

To an upper wall of the deposition chamber 28, an exhaust pipe 30 is connected. The exhaust pipe 30 is connected to an electric vacuum pump 32 at the end thereof and an inner pressure control valve 34 for deposition chamber 28 is provided at the middle thereof. The deposition chamber 28 in which the resin base plate 12 is disposed becomes in a vacuum state (reduced pressure state) by operating the vacuum pump 32 while the inner pressure control valve 34 is opened. The inner pressure (degree of vacuum) of the deposition chamber 28 is controlled by opening and closing the inner pressure control valve 34 by a controller, which is not shown, such that the inner pressure of the deposition chamber 28 to be detected by a pressure sensor, which is not shown and attached to the deposition chamber 28, reaches a predetermined value (target value).

Between the inner pressure control valve 34, which is positioned on the exhaust pipe 30, and the vacuum pump 32, a trap device 35 is disposed. The trap device 35 has a well-known structure and is designed to trap by-product(s) generated by the deposition process by vacuum deposition polymerization, which will be described later, and redundant monomers in the deposition process, for example.

At one side of the deposition chamber 28, a plasma generator 36 having a well-known structure is disposed. At a lower side of the deposition chamber 28, a mixing chamber 42 is disposed so as to communicate with the deposition chamber 28. To the mixing chamber 42, a first monomer inlet pipe **44*a*, a second monomer inlet pipe 44*b*, a third monomer inlet pipe 44*c*, and a fourth monomer inlet pipe 44*d* are connected. At the middle in the extending direction of the first to fourth monomer inlet pipes 44*a* to 44*d*, a first partition valve 46*a*, a second partition valve 46*b*, a third partition valve 46*c*, and a fourth partition valve 46*d* are provided, respectively. The first to fourth partition valves 46*a* to 46*d*** can be opened and closed, separately as needed, by a controller, which is not shown.

At the end of each of the first to fourth monomer inlet pipes **44*a* to 44*d*, a first evaporation source container 48*a*, a second evaporation source container 48*b*, a third evaporation source container 48*c*, and a fourth evaporation source container 48*d* are connected, respectively. All of the first to fourth evaporation source containers 48*a* to 48*d* are pressure-tight containers. At the outer periphery of the first to fourth evaporation source containers 48*a* to 48*d*, heaters 50*a*, 50*b*, 50*c* and 50*d* which heat the internal space of the first to fourth evaporation source containers 48*a* to 48*d*** are respectively disposed.

In the first to fourth evaporation source containers **48*a* to 48*d*, a first monomer 52*a*, a second monomer 52*b*, a third monomer 52*c*, and a fourth monomer 52*d*, which form the organic thin film 16, are respectively contained in a liquid form. Here, in the first evaporation source container 48*a*, 1,3-bis(isocyanatemethyl)cyclohexane is contained in a predetermined amount in a liquid form, as the first monomer 52*a*. In the second evaporation source container 48*b*, 1,12-dodecanediamine is contained in a predetermined amount in a liquid form, as the second monomer 52*b*. In the third evaporation source container 48*c*, methylene bis(4-cyclohexylamine) is contained in a predetermined amount in a liquid form, as the third monomer 52*c*. In the fourth evaporation, source container 48*d*, N-(2-aminoethyl)-3-aminopropyl methyl dimethoxy silane is contained in a predetermined amount in a liquid form, as the fourth monomer 52*d*. The monomers 52*a* to 52*d* contained in the evaporation source containers 48*a* to 48*d* can be suitably changed depending on a kind of the resin thin film constituting the organic thin film 16. When the organic thin film 16 is formed of a polyurea resin thin film, monomers 52*a* to 52*d* which are different from the above-described monomers 52*a* to 52*d* may be contained in the evaporation source containers 48*a* to 48*d***.

In the film-forming apparatus 26, the first to fourth evaporation source containers **48*a* to 48*d* are allowed to be in a vacuum state together with the deposition chamber 28 and the mixing chamber 42 by opening the first to fourth partition valves 46***a* to 46*d* at the operation of the vacuum pump 32. Further, the first to fourth evaporation source containers 48*a* to 48*d* in a vacuum state are heated by the heaters 50*a* to 50*d*, respectively, while the first to fourth partition valves 46*a* to 46*d* are closed, thereby evaporating the first to fourth monomers 52*a* to 52*d*, which are contained in the first to fourth evaporation source containers 48*a* to 48*d* in a liquid form, to be changed into vapor. The first to fourth monomers 52*a* to 52*d* which are changed into vapor are contained in the upper spaces of the first to fourth evaporation source containers 48*a* to 48*d* and in the portions of the first to fourth monomer inlet pipes 44*a* to 44*d*, which are positioned closer to the first to fourth evaporation source containers 48*a* to 48*d*, i.e., not upper than the first to fourth partition valves 46*a* to 46*d*. Then, under control of the controller, at least one of the first to fourth partition valves 46*a* to 46*d* is/are opened to open the corresponding at least one of the first to fourth monomer inlet pipes 44*a* to 44*d*. At that time, vapors of the at least one of the first to fourth monomers 52*a* to 52*d*, which is/are contained in the first to fourth evaporation source containers 48*a* to 48*d* connected to the opened first to fourth monomer inlet pipes 44*a* to 44*d*, is/are introduced into the mixing chamber 42 and the deposition chamber 28 through the at least one of the first to fourth monomer inlet pipes 44*a* to 44*d* which is/are opened.

When the organic thin film 16 is formed on the surface 13 of the resin base plate 12 by using the film-forming apparatus 26 having the above-described structure, initially, the resin base plate 12 is disposed in the deposition chamber 28 of the film-forming apparatus 26 such that the surface 13 faces the mixing chamber 42 side as shown in FIG. 2. The surface opposite to the surface 13 of the resin base plate 12 may be masked by a well-known manner.

Then, the first to fourth partition valves 46*a* to 46*d*, which are provided on the first to fourth monomer inlet pipes 44*a* to 44*d*, are opened. Under such condition, the vacuum pump 32 is operated to make the deposition chamber 28, the mixing chamber 42, the first to fourth monomer inlet pipes 44*a* to 44*d*, and the first to fourth evaporation source containers 48*a* to 48*d*, into vacuum state (reduced pressure state). This operation proceeds until the pressure in the deposition chamber 28 becomes about $1\times10^{-3}$ to $1\times10^{-1}$ Pa.

When the pressure in the deposition chamber 28 reached the predetermined value, the first to fourth partition valves 46*a* to 46*d* are all closed, and the first to fourth monomers 52*a* to 52*d* contained in the first to fourth evaporation source containers 48*a* to 48*d* in a liquid form are heated to about 80 to 150° C. by the heaters 50*a* to 50*d*, respectively. Accordingly, the first to fourth monomers 52*a* to 52*d* are evaporated to generate vapor of the first to fourth monomers 52*a* to 52*d* in the first to fourth evaporation source containers 48*a* to 48*d*.

Then, when a pressure detecting sensor (not shown), which is disposed in each of the evaporation source containers 48*a* to 48*d* to detect the inner pressure of the first to fourth evaporation source containers 48*a* to 48*d*, reached the predetermined value, the first partition valve 46*a* and the second partition valve 46*b* are opened under control of the controller, which is not shown. As a result, vapor of the first monomer 52*a* generated in the first evaporation source container 48*a* and vapor of the second monomer 52*b* generated in the second evaporation source container 48*b* are introduced into the mixing chamber 42 through the first and second monomer inlet pipes 44*a*, 44*b*.

The vapor of the first monomer 52*a* and the vapor of the second monomer 52*b* are introduced into the deposition chamber 28 and guided to the surface 13 of the resin base plate 12, while being mixed in the mixing chamber 42. On the surface 13 of the resin base plate 12, the first monomer 52*a* and the second monomer 52*b* are polymerized.

After a predetermined time (about 1 minute, for example) passed from the opening of the first partition valve 46*a* and the second partition valve 46*b*, only the second partition valve 46*b* is closed while the first partition valve 46*a* is kept opening. At the same time, the third partition valve 46*c* is opened. As a result, vapor of the third monomer 52*c* generated in the third evaporation source container 48*c* is introduced into the mixing chamber 42 through the third monomer inlet pipe 44*c*.

Then, the vapor of the first monomer 52*a* and the vapor of the third monomer 52*c* are introduced into the deposition chamber 28 and guided to the surface 13 of the resin base plate 12, while being mixed in the mixing chamber 42. On the surface 13 of the resin base plate 12, the first monomer 52*a* and the third monomer 52*c* are polymerized.

After a predetermined time (about 1 minute, for example) passed from the opening of the first partition valve 46*a* and the third partition valve 46*c*, only the third partition valve 46*c* is closed while the first partition valve 46*a* is kept opening. At the same time, the fourth partition valve 46*d* is opened. As a result, vapor of the fourth monomer 52*d* generated in the fourth evaporation source container 48*d* is introduced into the mixing chamber 42 through the fourth monomer inlet pipe 44*d*.

Then, the vapor of the first monomer 52*a* and the vapor of the fourth monomer 52*d* are introduced into the deposition chamber 28 and guided to the surface 13 of the resin base plate 12, while being mixed in the mixing chamber 42. On the surface of the resin base plate 12, the first monomer 52*a* and the fourth monomer 52*d* are polymerized.

Consequently, the organic thin film 16 having a structure shown in FIG. 1, which is constituted by a plurality of layers composed of different compositions, is formed on the surface 13 of the resin base plate 12. Specifically, by vacuum deposition polymerization, there is formed the organic thin film 16 consisting of the lower part 20, which is positioned at the resin base plate 12 side and formed of a polymer including the first monomer 52*a* and the second monomer 52*b*, the middle part 24, which is formed of a polymer including the first monomer 52*a* and the third monomer 52*c*, and the upper part 22, which is formed of a polymer including the first monomer 52*a* and the fourth monomer 52*d*. Then, after a predetermined time (about one minute, for example) passed from the opening of the fourth partition valve 46*d*, the first partition valve 46*a* and the fourth partition valve 46*d* are closed. Thus, the forming process of the organic thin film 16 is completed.

Then, the plasma generator 36 is activated. Thus, the surface of the organic thin film 16 is exposed to the plasma generated by the plasma generator 36. Accordingly, the surface of the organic thin film 16 is modified. In other words, a three-dimensional cross-linked structure is introduced into the organic thin film 16 to improve the wear-resistance and abrasion-resistance of the organic thin film 16, ultimately of the organic glass 10.

The surface of the organic thin film 16 may be modified by performing a corona treatment, a UV treatment or a heat treatment, to the organic thin film 16, for example. Further, prior to the forming operation of the organic thin film 16, the surface 13 of the resin base plate 12 may be cleaned or subjected to a surface activation treatment by performing a plasma treatment, a corona treatment, a UV treatment or a heating treatment, to the surface 13 of the resin base plate 12, according to the well-know manner.

A vacuum deposition process using an ultraviolet absorber or an infrared absorber may be carried out, prior to the formation of the organic thin film 16 by the above vacuum deposition polymerization, or during the forming operation, or posterior to the forming operation. When the vacuum deposition process is performed prior or posterior to the forming operation of the organic thin film 16, a thin film formed of an ultraviolet absorber or an infrared absorber is formed on the surface 13 of the resin base plate 12, or on a surface of the resin base plate 12 opposite to the side of the organic thin film 16. When the vacuum deposition process is performed during the forming operation of the organic thin film 16, an ultraviolet absorber or an infrared absorber is contained in the inside of the organic thin film 16 in a molecular state. Consequently, the weatherability of the resin base plate 12, ultimately of the organic glass 10, can be advantageously improved.

A vacuum deposition process using a pigment including a metal complex and the like may be performed, prior to the forming operation of the organic thin film 16, or during the forming operation, or posterior to the forming operation. When the vacuum deposition process is performed prior or posterior to the forming operation of the organic thin film 16, a colored layer is formed on the surface 13 of the resin base plate 12, or on the surface of the resin base plate 12 opposite to the side of the organic thin film 16. When the vacuum deposition process is performed during the forming operation of the organic thin film 16, the pigment is contained in the inside of the organic thin film 16 in a molecular state. Consequently, the surface of the organic glass 10 can be easily colored with a desired color.

A vacuum deposition process using a silane coupling agent may be performed, prior to the forming operation of the organic thin film 16, or during the forming operation, or posterior to the forming operation. When the vacuum deposition process is performed prior or posterior to the forming operation of the organic thin film 16, a thin film comprising the silane coupling agent is formed on the surface 13 of the resin base plate 12, or on the surface opposite to the resin base plate 12 side of the organic thin film 16. When the vacuum deposition process is performed during the forming operation of the organic thin film 16, the silane coupling agent is contained in the inside of the organic thin film 16 in a molecular state. Consequently, the adhesion between the resin base plate 12 and the organic thin film 16, and the adhesion between the organic thin film 16 and the inorganic thin film 18 can be effectively improved.

Examples of the above-described vacuum deposition processes using the ultraviolet absorber, the infrared absorber, the pigment, or the silane coupling agent includes PVD processes such as a vacuum deposition process, a sputtering process, an ion plating process, an electron beam deposition process, a molecular beam expitaxy process, an ionized deposition, and a pulsed laser deposition, and CVD processes such as a thermal CVD process, an ALE process, a plasma CVD process, and a MOCVD process.

After the organic thin film 16 is formed on the surface 13 of the resin base plate 12 as described above, the inorganic thin film 18 is formed on the organic thin film 16. This operation is performed while the resin base plate 12 including the organic thin film 16 formed on the surface 13 thereof is disposed in the deposition chamber 28 of the film-forming apparatus 26.

Specifically, after finishing the forming operation of the organic thin film 16 by closing the first partition valve **46*a* and the fourth partition valve 46*d*, the well known plasma CVD process is performed while the vacuum state of the deposition chamber 28 is maintained, so that the inorganic thin film 18, which is a thin film of silicon oxide, is formed on the organic thin film 16. Then, on the surface 13 of the resin base plate 12, the hard coat layer 14 consisting of the organic thin film 16 and the inorganic thin film 18 is formed. It is to be understood that, in FIG. 2, equipment for introducing the raw material gas into the deposition chamber 28 to form the inorganic thin film 18** by a plasma CVD process is not shown.

The vacuum deposition process that is carried out in the formation of the inorganic thin film 18 is not limited to the exemplified plasma CVD process. Other than the plasma CVD process, there may be exemplified PVD processes such as a sputtering process, a vacuum deposition process, a molecular beam epitaxy process, an ionized deposition, and a pulsed laser deposition, CVD processes such as a thermal CVD process, an ALE process, and a MOCVD process.

As described above, in the production of the organic glass 10 of the present embodiment, the vacuum deposition polymerization and the vacuum deposition process are continuously carried out in a dry type process, while the resin base plate 12 is disposed in the deposition chamber 28 of the film-forming apparatus 26. Accordingly, the hard coat layer 14 consisting of the organic thin film 16 and the inorganic thin film 18 is formed on the surface 13 of the resin base plate 12.

Consequently, due to the presence of the organic thin film 16 and the inorganic thin film 18, which are included in the hard coat layer 14 formed on the resin base plate 12, the organic glass 10 of the present embodiment can exhibit excellent weatherability and can have the improved wear-resistance and abrasion-resistance.

Further, unlike the conventional organic glass that contains a hard coat layer consisting of the organic coating film and inorganic thin film, which are formed on the surface of the resin base plate by performing a wet coating process and a dry vacuum deposition process in separate apparatuses, the production of the organic glass of the present embodiment does not require a drying process and an apparatus for drying, an apparatus for purifying the environment for deposition, and the like. As a result, the production cycle can be shortened and reduction in the production cost can be effectively achieved.

Further, unlike the conventional organic glass including the organic coating film, since the hard coat layer 14 of the organic glass 10 does not contain an organic coating film, it can be advantageously prevented that the extra time is required for the vacuum evacuation due to the degassing from the organic coating film. Further, on the hard coat layer 14, a primer layer or the like for improving the adhesion is not formed. It also improves the productivity and reduces the running cost and production cost effectively.

In the organic glass 10 of the present invention, an ultraviolet absorber or an infrared absorber, for example, can be contained in the organic thin film 16 by performing the vacuum deposition process simultaneously with the formation of the organic thin film 16 by the vacuum deposition polymerization. As a result, the weatherability can be further improved easily without extending the production cycle. Generally, when adding the ultraviolet absorber, the infrared absorber, or the like into the organic coating material, addition amount thereof is limited in order to maintain a state such that the organic coating material can be treated as a coating material. However, the addition amount of the ultraviolet absorber, the infrared absorber or the like is not limited in the present embodiment, because the coating material is not used in the present embodiment. Therefore, sufficient amount of the ultraviolet absorber, infrared absorber or the like can be used and the weatherability can be advantageously improved.

The inventors of the present invention conducted various evaluation tests to confirm if the organic glass 10 of the present invention exhibits the above-described excellent characteristics. Hereinafter, the various evaluation tests will be described in detail.

Initially, a resin base plate formed of a transparent flat plate having a thickness of 4 mm and made of polycarbonate was prepared by a well-known injection molding process. Meanwhile, an apparatus for forming an organic thin film, which has a structure shown in FIG. 2, was provided. Further, in the first evaporation source container of the apparatus, 1,3-bis(isocyanatemethyl)cyclohexane solution was contained, in the second evaporation source container, 1,12-dodecanediamine solution was contained, in the third evaporation source container, methylene bis(4-cyclohexylamine) solution was contained, and in the fourth evaporation source container, N-(2-aminoethyl)-3-aminopropyl methyl dimethoxy silane solution was contained. The amount of each monomer contained in each evaporation source container was determined so as to be enough to conduct a polymerization reaction between the monomer in the first evaporation container and each of the monomers in the second to fourth evaporation source containers.

Then, an organic thin film of polymer was formed on the resin base plate by performing the vacuum deposition polymerization in the same manner as in the production of the above example of the organic glass. Specifically, the vacuum pump of the apparatus for forming an organic thin film was operated to make the deposition chamber and each evaporation source container in a vacuum state (reduced pressure state). The pressure in the deposition chamber in a vacuum state was about $1\times10^{-3}$ to $1\times10^{-1}$ Pa. Then, after all of the evaporation source containers were hermetically sealed, the monomer in each evaporation source container was heated to be evaporated, thereby generating evaporation of the monomer in each evaporation source container. The heating temperature of the monomer was 80 to 150° C. Then, when the internal pressure of each evaporation source container reached a predetermined value, the first evaporation source container and the second evaporation source container were opened, thereby introducing vapor of 1,3-bis(isocyanatemethyl)cyclohexane and vapor of 1,12-dodecanediamine, which were generated in the first and second evaporation source container, into the deposition chamber. Thus, 1,3-bis(isocyanatemethyl)cyclohexane and 1,12-dodecanediamine were polymerized on the surface of the resin base plate. Subsequently, one minute after the opening of the first and second evaporation source containers, the second evaporation source container was closed. At the same time, the third evaporation source container was opened to introduce vapor of methylene bis(4-cyclohexylamine), which was generated in the third evaporation source container, into the deposition chamber. Thus, 1,3-bis(isocyanatemethyl)cyclohexane and methylene bis(4-cyclohexylamine) were polymerized on the surface of the resin base plate. Then, one minute after the opening of the third evaporation source container, the third evaporation source container was closed. At the same time, the fourth evaporation source container was opened to further introduce vapor of N-(2-aminoethyl)-3-aminopropyl methyl dimethoxy silane, which was generated in the fourth evaporation source container, into the deposition chamber. Thus, 1,3-bis(isocyanatemethyl)cyclohexane and N-(2-aminoethyl)-3-aminopropyl methyl dimethoxy silane were polymerized on the surface of the resin base plate. Then, one minute after the opening of the fourth evaporation source container, the first evaporation source container and the fourth evaporation source container were closed to finish the vacuum deposition polymerization. Consequently, the organic thin film having a plurality of layers which varies in composition was formed on a surface of the resin base plate. The thickness of the organic thin film formed herein was 50 μm.

Then, while the resin base plate on which the organic thin film was formed was disposed in the deposition chamber in a vacuum state, an inorganic thin film formed of silicon oxide was formed on a surface of the organic thin film opposite to the resin base plate side by well known plasma CVD process. The thickness of the inorganic thin film formed herein was 5 μm. Thus, the intended organic glass was obtained in which the hard coat layer consisting of the organic thin film and the inorganic thin film was formed on a surface of the resin base plate.

A test piece was cut out from the above-obtained organic glass. By using the test pieces, evaluation tests were carried out regarding optical characteristic, appearance, adhesion at ambient temperature, adhesion after heat cycle test, wear-resistance, warm water resistance, moisture resistance, heat resistance, accelerated weatherability, and impact resistance. The results thereof are shown in the following FIG. 1.

Evaluation tests were conducted as follows.

<Optical Characteristic>

Optical characteristic was evaluated in accordance with JIS K 7105.

<Appearance>

Appearance was evaluated by visual observation.

<Adhesion at Ambient Temperature>

Adhesion at ambient temperature was evaluated in accordance with JIS D 0202. Specifically, a utility knife was vertically pressed against a surface of a hard coat layer of the test piece and grids of 1 mm×1 mm (100 squares) were drawn. Then, an adhesion tape having adhesion strength of 0.44±0.05 kgf/mm was pressure bonded to the surface, which was cut into grids, and the tape was rapidly tore off from the surface at an angle of 45°.

<Adhesion after Heat Cycle Test>

Adhesion was evaluated in accordance with JIS D 0202, after a cycle of −18° C.×2 hr→23° C.×50% RH×2 hr→80° C.×50% RH×2 hr was repeated 10 times.

<Wear-Resistance>

Wear-resistance was evaluated in accordance with ASTM D 1044. Specifically, the test piece was attached to a taper abrasion tester and rubbed with a load of 4.9 N.

<Warm Water Resistance>

The test piece was immersed in warm water of 40° C. for 240 hours. Then, the adhesion was evaluated in accordance with JIS D 0202.

<Moisture Resistance>

Moisture resistance was evaluated in accordance with JIS R 3212. Specifically, the test piece was allowed to stand in a thermostat that was controlled at 50±2° C. and 95% RH or more for 2 weeks. Then, adhesion was evaluated.

<Heat Resistance>

The test piece was allowed to stand under atmosphere of 80° C. for 168 hours. Then, adhesion was tested in accordance with JIS D 0202.

<Accelerated Weatherability>

Accelerated weatherability was evaluated in accordance with JIS R 3212. Specifically, by using a Sunshine Carbon Arc Weather-ometer, at black panel temperature of 63±3° C., a cycle of irradiation for 48 minutes and irradiation and spray with pure water for 12 minutes was repeated 1000 times on the test piece.

<Impact Resistance>

Impact resistance was evaluated in accordance with JIS K 5400. Specifically, a steel ball having a diameter of 38 mm and weight of 227 g was dropped from the height of 2.5 m at 23° C.

TABLE 1

| Evaluation Item | | Evaluation Results |
|---|---|---|
| Optical Characteristic | Light transmission: T | 89 to 94 |
| | Haze | 0 to 0.1 |
| Appearance | | no foreign substance |
| Adhesion at ambient temperature | | no separation |
| Adhesion after heat cycle test | | no crack, no separation |
| Wear-resistance | | no separation after 500 times of rubbing |
| Warm water resistance | | no separation |
| Moisture resistance | | no separation |
| Heat resistance | | no separation |
| Accelerated weatherability | | no crack, no discolored part |
| Impact resistance | | no crack, no separation |

It can be clearly understood by the results shown in FIG. 1 that the organic glass having a structure of the present invention, which includes the hard coat layer consisting of the organic thin film formed by vacuum deposition polymerization and the inorganic thin film formed by the vacuum deposition process, on the surface of the resin base plate, has excellent appearance and high adhesion, and suffers from no crack and no separation after heat cycle test, and further has excellent weatherability and wear-resistance.

While the specific embodiment of the present invention has been described in detail, for illustrative purpose only, it is to be understood that the present invention is not limited to the details of the illustrated embodiments.

For example, the hard coat layer 14 is formed only on the surface 13, which is one surface of the resin base plate 12, in the present embodiment. However, the hard coat layer 14 may be formed on the other surface of the resin base plate 12, or may be formed on both surfaces, i.e., the surface 13 and the other surface.

The hard coat layer 14 only needs to include at least the organic thin film 16. Therefore, the hard coat layer 14 can be made without the inorganic thin film 18. Although the organic glass 10 without the inorganic thin film 18 has the wear-resistance and abrasion-resistance that is a little bit inferior to one with the inorganic thin film 18, it can be sufficiently used as a ventilation window or sunroof, for example, which is not rubbed by the wiper or up and down movement.

The organic thin film 16 may be constituted by a single layer composed of a single composition.

In the present embodiment, the organic thin film 16 and the inorganic thin film 18 are formed on the resin base plate 12 by a continuous process in the deposition chamber 28 of the film-forming apparatus 26. However, separate apparatus or equipment may be used to form the organic thin film 16 onto the resin base plate 12 and to form the inorganic thin film 18 onto the organic thin film 16.

In the formation of the organic thin film 16 onto the resin base plate 12, an apparatus or equipment other than the exemplified film-forming apparatus 26 can be used.

In addition to the exemplified window glass for automobile and process for producing the same, the present invention is advantageously applicable to all organic glasses (for example, surface panel of solar panel and various glasses for mirror) for automobiles, which are used instead of inorganic glass, and is also applicable to a process for producing the same. Further, other than the organic glass for automobile, the present invention is applicable to a train window, a windshield of motorcycle, a helmet visor, and lens for eyewear and a process for producing the same.

Although further details will not be described herein, it is to be understood that the present invention may be embodied with various other changes and modifications which may occur to those skilled in the art, without departing from the spirit and scope of the invention.

What is claimed is:

1. An organic glass for automobile comprising a transparent resin base plate and a hard coat layer directly formed on at least one surface of the resin base plate, wherein the hard coat layer includes an organic thin film of polymer formed by vacuum deposition polymerization, wherein the organic thin film is constituted by a plurality of layers composed of different compositions, and wherein the hardness of the organic thin film varies to become higher stepwise toward the surface thereof.

2. The organic glass for automobile according to claim 1, wherein the organic thin film is a thin film of polyurea resin.

3. The organic glass for automobile according to claim 1, wherein the organic thin film has a thickness within a range of 10 to 100 μm.

4. The organic glass for automobile according to claim 1, wherein the hard coat layer further includes an inorganic thin film that is formed by a vacuum deposition process on the organic thin film at the side opposite to the resin base plate.

5. The organic glass for automobile according to claim 4, wherein the inorganic thin film has a thickness within a range of 100 nm to 20 μm.

6. The organic glass for automobile according to claim 4, wherein the inorganic thin film is a thin film comprising a metal compound.

7. The organic glass for automobile according to claim 4, wherein the inorganic thin film is a thin film of silicon oxide ($SiO_2$).

8. The organic glass for automobile according to claim 1, wherein the resin base plate is formed of a resin material selected from the group consisting of polymethyl methacrylate, polyethylene terephthalate, polyethylene naphthalate, polyethylene, polypropylene, and ABS.

9. The organic glass for automobile according to claim 1, wherein at least one of an ultraviolet absorber, an infrared absorber, pigment and silane coupling agent is contained in the hard coat layer by a vacuum deposition process.

10. A process for producing an organic glass for automobile, comprising the steps of:

providing a transparent resin base plate; and forming an organic thin film of polymer directly on at least one surface of the resin base plate by a vacuum deposition polymerization, thereby forming a hard coat layer including the organic thin film on at least one surface of the resin base plate, wherein the organic thin film is constituted by a plurality of layers composed of different compositions, and wherein the hardness of the organic thin film varies to become higher stepwise toward the surface thereof.

11. The process for producing an organic glass for automobile according to claim 10, wherein the vacuum deposition polymerization is performed by introducing a plurality of kinds of monomers evaporated in a plurality of evaporation source containers into a deposition chamber in a vacuum state, while changing a combination of the monomers to be introduced into the deposition chamber with the passage of time, so that the organic thin film directly formed on the at least one surface of the resin base plate is constituted by a plurality of layers composed of different compositions.

* * * * *